United States Patent
Chen et al.

(12) 
(10) Patent No.: US 6,365,321 B1
(45) Date of Patent: Apr. 2, 2002

(54) BLENDS OF HYDROXYSTYRENE POLYMERS FOR USE IN CHEMICALLY AMPLIFIED POSITIVE RESIST FORMULATIONS

(75) Inventors: Kuang-Jung Chen; Ronald Anthony DellaGuardia, both of Poughkeepsie, NY (US); Hiroshi Ito, San Jose, CA (US); George Michael Jordhamo, Hopewell Junction; Ahmad Dauod Katnani, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/291,389

(22) Filed: Apr. 13, 1999

(51) Int. Cl.$^7$ ................................. G03F 7/004
(52) U.S. Cl. ..................... 430/270.1; 430/905; 430/910
(58) Field of Search ............................. 430/270.1, 905, 430/910

(56) References Cited

U.S. PATENT DOCUMENTS

| | | | | |
|---|---|---|---|---|
| 5,482,816 A | * | 1/1996 | Murata et al. | 430/270.14 |
| 5,492,793 A | | 2/1996 | Breyta et al. | 430/270.14 |
| 5,547,812 A | * | 8/1996 | Collins et al. | 430/270.1 |
| 5,556,734 A | * | 9/1996 | Yamachika et al. | 430/270.1 |
| 5,625,020 A | | 4/1997 | Breyta et al. | 526/329.2 |
| 5,679,495 A | * | 10/1997 | Yamachika et al. | 430/191 |
| 5,759,739 A | * | 6/1998 | Takemura et al. | 430/270.1 |
| 5,861,231 A | | 1/1999 | Barclay et al. | 430/270.1 |
| 5,962,180 A | * | 10/1999 | Iwanaga et al. | 430/170 |
| 5,962,184 A | * | 10/1999 | Allen et al. | 430/270.1 |

FOREIGN PATENT DOCUMENTS

EP  0813113 A1  12/1997

OTHER PUBLICATIONS

Ito et al. (1994), "Environmentally Stable Chemical Ammplification Positive Resist: Principle, Chemistry, Contamination Resistance, and Lithographic Feasibility," *Journal of Photopolymer Science and Technology*, 7(3):433–447.

Kawai et al. (1992), "Characteristics of a Monodisperse PHS–Based Positive Resist (MDPR) in KrF Excimer Laser Lithography," *Jpn. J. Appl. Phys.* 31(12B):4316–4320.

Wallraff et al. (1998), "Etch Selectivity of 4SiMA:Hydroxystyrene Based Copolymers. Silicon Chemistry for Bilayer Resist Systems," *Journal of Photopolymer Science and Technology* 11(4):673–680.

* cited by examiner

Primary Examiner—John S. Chu
(74) Attorney, Agent, or Firm—Reed & Associates (57) ABSTRACT

A photoresist binder composition comprising a homogeneous blend of (i) a hydroxystyrene copolymer comprising a first monomer that is optionally substituted hydroxystyrene and a second monomer containing an acid labile group, preferably pendant to the polymer backbone, and (ii) a phenolic polymer, that is optionally partially or wholly protected, such as polyhydroxystyrene, poly (hydroxystyrene-co-styrene), poly(hydroxystyrene-co-styrene-co-t-butyl acrylate), novolac, and the like. Also provided is a lithographic resist composition comprising the homogeneous blend of the photoresist binder composition, and a radiation-sensitive acid generator which generates an acid upon exposure to radiation, and a process for using the resist composition to generate resist images on a substrate, such as in the manufacture of integrated circuits or the like.

69 Claims, 2 Drawing Sheets

BLENDS OF HYDROXYSTYRENE POLYMERS FOR USE IN CHEMICALLY AMPLIFIED POSITIVE RESIST FORMULATIONS

TECHNICAL FIELD

This invention relates generally to chemically amplified positive photoresist (or "resist") compositions for use in lithography and a process for its use in the manufacture of integrated circuits. The invention additionally pertains to blends of polymers useful as binders in resist compositions, to novel resist compositions containing the polymer blends, and to methods for using the resist compositions to generate a resist image on a substrate.

BACKGROUND

The currently available chemical amplification positive resist compositions usually contain as a binder consisting of a copolymer or a terpolymer having a base-soluble functionality and/or a dissolution-inhibiting functionality, and a photoactive acid generator. These resist compositions are used for transferring images to a substrate, such as in the manufacture of high circuit density microelectronic devices. In general, a coating layer of the resist composition is formed on a substrate, and the layer is then exposed to radiation through a photomask incorporating a pattern. Exposure to the radiation induces a chemical transformation of the composition thereby transferring the pattern of the photomask to the resist coating on the substrate. After exposure, the photoresist is developed to provide a relief image that permits selective processing of the substrate.

The resist can be positive acting or negative acting. In a positive resist, the area exposed to radiation becomes more soluble in a developer solution while the area not exposed remains essentially insoluble. The solubility differentials between the exposed and the unexposed areas is attained by a deprotecting reaction of the polymer. The disadvantages of the positive resist composition includes cleavage of a substantial mass of the resist as a result of the deprotection reaction, which in turn can cause significant shrinkage of the area of the resist coating layer exposed to activating radiation. An alternative to positive resist composition is a negative-acting resist where the resist polymerizes or crosslinks upon exposure to radiation.

Thus, the area exposed to radiation becomes less soluble in the developer solution than the unexposed portions.

The binder component of the resist is usually a co-polymer, with the poly(hydroxystyrene-co-t-butyl acrylate) polymer being one of the most widely used. The poly(hydroxystyrene-co-t-butyl acrylate) polymer has a high dissolution rate when exposed to radiation. However, the polymer exhibits poor quality in printing isolated lines, thereby making it unsuitable for the fabrication of logic devices. In addition, it is subject to shrinkage.

As an alternative, a binder consisting of a terpolymer, such as poly(hydroxystyrene-co-t-butyl acrylate-co-styrene), has been utilized. However, terpolymers are inherently more complex than co-polymers in structure and their microstructure is more difficult to predict and control. Furthermore, control of the physical properties of terpolymers, especially their dissolution rates, requires precise control of the composition that is determined by the polymerization procedure.

The constraints associated with the use of terpolymers could be overcome by the use of a blend of two or more different polymers that exhibit the desired properties. In addition, the blend would be more economical to manufacture and use, and the physical properties could be more easily controlled. However, different polymers are generally immisible with each other and have a strong tendency to phase-separate. Thus, it is difficult to obtain a homogeneous blend of two polymers that could function as a resist.

Accordingly, it would be desirable to have a resist composition containing as a binder homogeneous blend of two or more polymers that exhibits enhanced lithographic performance and/or resistance to etching environments. Further, it would be desirable to have a chemically amplified positive resist formulation that does not exhibit significant shrinkage during exposure and other processing steps, and that forms highly resolved isolated lines suitable for the fabrication of integrated circuits.

SUMMARY OF THE INVENTION

The present invention relates to a photoresist binder composition comprising a homogeneous blend of (i) a copolymer comprising a first monomer that is a substituted or unsubstituted hydroxystyrene and a second monomer containing an acid labile group, preferably pendant to the polymer backbone, and (ii) and a phenolic polymer, that is optionally partially or wholly protected, such as polyhydroxystyrene, poly(hydroxystyrene-co-styrene), poly (hydroxystyrene-co-styrene-co-t-butyl acrylate), novolac, and the like.

The invention additionally relates to a lithographic resist composition, comprising a photoresist binder composition as above, and a radiation-sensitive acid generator which generates an acid upon exposure to radiation.

In a further embodiment, the present invention relates to the use of the novel resist composition to make integrated circuits. One such process involves the steps of (a) coating a substrate with a film comprising the aforementioned lithographic resist composition; (b) exposing the film selectively to a predetermined pattern of radiation to form a latent image therein; and (c) developing the image using a suitable developer composition. Step (b) involves the use of x-ray, electron beam or ultraviolet radiation, preferably "deep" ultraviolet radiation having a wavelength of less than about 300 nm, more preferably having a wavelength of 248 nm.

DETAILED DESCRIPTION OF THE INVENTION

Overview and Definitions

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the context clearly dictates otherwise. Thus, for example, reference to a "monomer" includes mixtures of different monomers, reference to "a phenolic polymer" includes mixtures of different phenolic polymers, a "photosensitive acid generator" includes a mixture of two or more such compounds, and the like.

In describing and claiming the present invention, the following terminology will be used in accordance with the definitions set out below.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "secondary alkyl" intends a branched alkyl group of one to six carbon atoms. The term "lower alkyl" intends an alkyl group of one to six carbon atoms, preferably one to four carbon atoms, the term "alkyl ester" refers to an ester functionality —C(O)O—R wherein R is lower alkyl, and the term "alkylthio" refers to a thiol functionality R—S— wherein R is lower alkyl.

The term "alkoxy" as used herein refers to a substituent —O—R wherein R is alkyl. The term "lower alkoxy" refers to such a group wherein R is lower alkyl.

The term "aryl" as used herein refers to an aromatic species containing 1 to 3 aromatic rings, either fused or linked, and either unsubstituted or substituted with 1 or more substituents typically selected from the group consisting of lower alkyl, lower alkoxy, halogen, and the like. Preferred aryl substituents contain 1 aromatic ring or 2 fused or linked aromatic rings.

The term "halogen," refers to fluoro, chloro, bromo or iodo, and usually relates to halogen substitution for a hydrogen atom in an organic compound.

The terms "optional" or "optionally" means that the subsequently described circumstance may or may not occur, and that the description includes instances where said circumstance occurs and instances where it does not. For example, the phrase "the free hydroxyl groups of the phenolic polymer are optionally protected" means that a protecting group may or may not be present on the phenolic polymer and that the description includes both the instance when the protecting group is present and the instance when the protecting group is not present.

The term "hydroxystyrene copolymer" as used herein refers to a polymer composed of two monomers wherein hydroxystyrene, optionally substituted, is one of the monomers.

The terms "acid-labile" and "acid-cleavable" are used interchangeably herein to refer to a molecular moiety that undergoes a change in structure upon contact with acid, e.g., an ester that, upon contact with acid, is hydrolyzed to an acid, a carbonate ester that, upon contact with acid, is hydrolyzed to a hydroxyl group, or the like. The groups that are "acid-labile" or "acid-cleavable" in the context of the present invention are also referred to as "acid-labile protecting groups" or simply as "acid-labile functionalities."

Conversely, the term "acid-inert" to refer to other protecting groups is intended to mean that a molecular moiety does not undergo a change in structure upon contact with acid, e.g., an alkoxy group or the like.

The terms "photogenerated acid" and "photoacid" are used interchangeably herein to refer to the acid that is created upon exposure of the present compositions to radiation, i.e., as a result of the radiation-sensitive acid generator in the compositions.

For additional information concerning terms used in the field of lithography and lithographic compositions, reference may be had to *Introduction to Microlithography*, Eds. Thompson et al. (Washington, D.C.: American Chemical Society, 1994).

The Photoresist Binder Composition

The present invention in a first embodiment relates to a photoresist binder composition comprising a homogeneous blend of a hydroxystyrene copolymer, preferably but not necessarily as shown in Formula I, and a phenolic polymer, preferably but not necessarily as shown in Formula II, where the free hydroxyl groups of the phenolic polymer are optionally protected with a pendant group that is acid inert and generally not cleavable in the presence of a photogenerated acid, or are optionally protected with a pendant group that is acid labile and is cleavable by a photogenerated acid.

Formula (I)

Formula (II)

The homogeneous blend of polymers is useful as a binder in a lithographic resist composition that additionally includes a radiation-sensitive acid generator, and optionally a dissolution inhibitor, an acid-diffusion controlling additive, or other materials as will be discussed below.

The Hydroxystyrene Copolymer

The hydroxystyrene copolymer (Formula (I)) is comprised of a first monomer unit that is substituted or unsubstituted hydroxystyrene and a second monomer unit containing photoacid-cleavable groups. The hydroxystyrene is the ortho, para or meta isomer (preferably para) and can be substituted with various substituents which do not interfere with the lithographic utility of the polymer. Substituent $R_1$ of Formula I may be, for example, halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted sulfonyl preferably having 1 to about 8 carbon atoms such as mesyl ($CH_3SO_2O$—), substituted or unsubstituted alkyl esters such as those represented by RCOO— where R is an alkyl group preferably having 1 to about 10 carbon atoms, substituted or unsubstituted alkylthio preferably having 1 to about 8 carbons, cyano, nitro, etc, and m=1, 2, 3, or 4. Also, when m is 2 or more, the different $R_1$ groups may or may not be the same, and two $R_1$ groups on adjacent carbon atoms may be taken together to form (with ring carbons to which they are attached) one, two or more fused aromatic or alicyclic rings having from 4 to about 8 ring members per ring. For example, two $R_1$ groups can be taken together to form (together with the phenol depicted in Formula I) a naphthyl or acenaphthyl ring. In addition, R' substituent can be hydrogen, or substituted or unsubstituted alkyl having from 1 to about 8 carbon atoms, preferably from 1 to about 3 carbon atoms. The preferred monomers are hydroxystyrene and α-methyl hydroxystyrene.

The second monomer unit containing the photoacid-cleavable group undergoes photoacid-induced cleavage upon exposure of a coating layer of a photoresist containing the polymer to provide a solubility differential between the exposed and unexposed regions of the resist coating. The second monomer unit generally inhibits the dissolution of the polymer in an alkaline developer or a polar solvent, but upon imagewise exposure to radiation, the photogenerated acid cleaves the acid-labile group, converting it to a base soluble organic acid functionality, and thereby enabling image development. The photoacid-cleavable groups are preferably pendant to the polymer backbone.

The polymer backbone is typically comprised of acrylate monomers containing substituted ester moieties and can be formed by free radical or other polymerization of acrylate monomers. Substituent R" of Formula I is H, methyl, ethyl or halogen, particularly F or Cl. Thus, the acrylate monomer of the polymer backbone is comprised of acrylate, methacrylate, ethacrylate, fluoroacrylate and chloroacrylate. The ester moiety of the condensed acrylate unit ($R_2$—O—C(=O)—) serves as the pendant acid labile group. A wide variety of acrylate units may be employed including those having an ester group (group $R_2$ above) that is a non-cyclic or cyclic alkyl having 1 to about 14 carbon atoms, more typically 1 to about 8 carbons. Also suitable will be such alkyl ester groups that have one or more substituents such as halogen, particularly F, Cl or Br, $C_{1-6}$ alkoxy, or aryl such as phenyl. Particularly preferred ester groups are tertiary alkyl esters such as t-butyl and substituted t-butyl esters of carboxylic acids. Other suitable ester groups include a-methylbenzyl, α,α-dimethylbenzyl, tetrahyropyran-2-yl, tetrahydrofuran-2-yl, alicyclic ester substituents (e.g., $C_7$–$C_{12}$) which are acid-cleavable with tertiary attachment points such as adamantyl, norbornyl or isobornyl derivatives, e.g., 2-methyl-2-adamantyl, 2-methyl-2-isobornyl, 2-methyl-2-tetracyclododecenyl, 2-methyl-2-dihydrodicyclopentadienylcyclohexyl and 1-methylcyclohexyl. However, it will be appreciated by those skilled in the art that a wide range of other acid-labile groups are possible. Examples of such additional acid-sensitive groups are set forth in U.S. Pat. No. 4,491,628 to Ito et al., entitled "Positive- and Negative-Working Resist Compositions with Acid-Generating Photoinitiator and Polymer with Acid Labile Groups Pendant from Polymer Backbone," and the *Handbook of Microlithography, Micromachining, and Microfabrication, Vol. 1: Microlithography,* Ed. P. Raj-Coudhury, p. 321 (1997). Preferred acid-cleavable monomers useful in the practice of the present invention include the t-butyl esters of acrylates. Exemplary compounds that may be condensed to provide the second monomer unit of the hydroxystyrene copolymer of the invention include methacrylate, ethacrylate, methyl methacrylate, ethyl methacrylate, butyl acrylate including t-butyl acrylate, and butyl methacrylate including t-butyl methacrylate. Such monomers are commercially available or can be readily prepared by known procedures.

The hydroxystyrene copolymer described above can be prepared by standard procedures, typically although not necessarily involving radical copolymerization of the two monomer units to yield random copolymers. For example, t-butyl methacrylate or the like can be copolymerized with hydroxystyrene or a hydroxystyrene derivative. The monomers can be protected if desired. In one such case, t-butyl methacrylate can be copolymerized with (i) p-t-butoxycarbonyloxystyrene with subsequent thermal cleavage or mild acidolysis of the t-butoxycarbonyl group to form p-hydroxystyrene/ t-butyl methacrylate copolymer or (ii) p-t-butyl(dimethyl)silyloxystyrene, with subsequent desilylation with fluoride. Alternatively, in another example, acetoxystyrene is copolymerized with acrylate or methacrylate. Generally, acetoxystyrene is mixed under nitrogen at an elevated temperature of about 50° C. to 100° C. with the ester monomer in a suitable solvent such as toluene or THF, along with a small amount of a free radical catalyst such as benzoyl peroxide or AIBN. The product polymer poly (acetoxystyrene-co-acrylate) is then deacylated with mild base (e.g. dimethylaminopyridine, ammonium hydroxide, carbonate or bicarbonate) in a nonaqueous solvent such as an alcohol solvent (methanol or propanol) to form the hydroxystyrene/acrylate copolymer. Alternatively, the hydroxystyrene/acrylate or methacrylate copolymer can be a block copolymer.

The Phenolic Polymer

The second component of the homogeneous blend in the photoresist binder composition is a phenolic polymer to improve resist performance. The phenolic polymer can be a homopolymer, a copolymer, or a terpolymer. When the phenolic polymer is a homopolymer, the monomer unit is substituted or unsubstituted hydroxystyrene wherein the hydroxyl group is at 2, 3, or 4 position of the aromatic ring. When the phenolic polymer is a copolymer, as shown in Formula (II), the first monomer unit is a substituted or unsubstituted hydroxystyrene and the second monomer unit is a substituted or unsubstituted styrene or a differently substituted hydroxystyrene. Substituent $R_3$ of Formula II may be, for example, halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted sulfonyl preferably having 1 to about 8 carbon atoms such as mesyl ($CH_3SO_2O$—), substituted or unsubstituted alkyl esters such as those represented by RCOO— where R is an alkyl group preferably having 1 to about 10 carbon atoms, substituted or unsubstituted alkylthio preferably having 1 to about 8 carbons, cyano, nitro, etc, and n=1, 2, 3, or 4. Also, when n is 2 or more, the different $R_3$ groups may or may not be the same, and two $R_3$ groups on adjacent carbon atoms may be taken together to form (with ring carbons to which they are attached) one, two or more fused aromatic or alicyclic rings having from 4 to about 8 ring members per ring. The phenolic polymer, if desired, can have narrow polydispersity.

When the phenolic polymer is a terpolymer, the first monomer unit is a substituted or unsubstituted hydroxystyrene, the second monomer unit is a substituted or unsubstituted styrene or a differently substituted hydroxystyrene, and the third monomer unit additionally comprises substituted or unsubstituted alkyl acrylates such as acrylate, methacrylate, ethacrylate, methyl methacrylate, ethyl methacrylate, t-butyl acrylate, or t-butyl methacrylate.

A copolymer of hydroxystyrene and styrene is the preferred phenolic polymer for blends for use in 248 nm positive-tone single-layer imaging. Novolac resins can be used for use in a blend for near UV (approximately 365 nm), electron beam, and x-ray imaging. Novolac resins are the thermoplastic condensation products of a phenol and an aldehyde. Examples of suitable phenols for condensation with an aldehyde, particularly, although not necessarily, formaldehyde, are phenol, m-cresol, o-cresol, p-cresol, 2,4-xylenol, 2,5-xylenol, 3,4-xylenol, 3,5-xylenol and thymol. Preferred novolac resins for use herein are the cresol formaldehyde condensation products. Other inert polymers include, for example, homopolymers or copolymers of vinylphenols.

The hydroxystyrene monomeric unit in the preferred phenolic polymer herein optionally contains a pendant substituent on a fraction of the free hydroxyl groups so that the hydroxystyrene is partially protected with an acid-inert group or an acid-labile group. The acid-cleavable protecting groups are generally as described above, but for the phenolic polymer, preferred acid cleavabe groups are carbonate such as a tBOC-protected phenol or the like. Other suitable ester groups include alicyclic ester substituents (e.g., $C_7$–$C_{12}$) which are acid-cleavable with tertiary attachment points such as adamantyl, norbornyl or isobornyl derivatives, e.g., 2-methyl-2-adamantyl, 2-methyl-2-isobornyl, 2-methyl-2-tetracyclododecenyl, 2-methyl-2-dihydro-dicyclopentadienylcyclohexyl and 1-methylcyclohexyl. The protecting group inert to acidolysis can be primary alkyl, secondary alkyl, aryl, acetyl, primary carbonate, or a secondary carbonate group.

The phenolic polymers with narrow molecular weight distributions are prepared by living anionic polymerization or living radical polymerization by methods well known in the art, and the phenolic polymers can be random or block polymers.

The photoresist binder composition comprises a homogeneous blend of the protected copolymer and the phenolic polymer in a ratio to give the desired dissolution rate. In general, the mole ratio of the hydroxystyrene copolymer to the phenolic polymer is in the range of about 70:30 to about 30:70, preferably in the range of about 60:40 to about 40:60.

The Lithographic Resist Composition

The novel lithographic resist composition herein comprises a binder composition as described in the preceding section, i.e., a homogeneous blend of a hydroxystyrene copolymer and a phenolic polymer, and an acid generator, with the homogeneous blend representing up to about 99wt. % of the solids included in the composition, and the acid generator representing approximately 0.5–10 wt. % of the solids contained in the composition. Other components and additives may also be present.

Upon exposure to radiation, the radiation-sensitive acid generator generates an acid. A variety of photosensitive acid generators (also referred to herein as "PAGs") can be used in the composition of the present invention. Generally, suitable acid generators have a high thermal stability (preferably to temperatures greater than 140° C.) so they are not degraded during pre-exposure processing. Generally, sulfonate compounds are preferred PAGs, particularly sulfonate salts, but other suitable sulfonate PAGs include sulfonated esters and sulfonyloxy ketones. See U.S. Pat. No. 5,344,742 to Sinta et al., and *J. Photopolymer Science and Technology,* 4:337–340 (1991), for disclosure of suitable sulfonate PAGs, including benzoin tosylate, t-butylphenyl α-(p-toluenesulfonyloxy)-acetate and t-butyl α-(p-toluenesulfonyloxy)-acetate. Onium salts are also generally preferred acid generators of compositions of the invention. Onium salts that weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts and sulfoxonium salts or selenium salts. Examples of suitable preferred onium salts can be found in U.S. Pat. Nos. 4,442,197, 4,603,101, and 4,624,912. Other useful acid generators include the family of nitrobenzyl esters, and the s-triazine derivatives. Suitable s-triazine acid generators are disclosed, for example, in U.S. Pat. No. 4,189,323.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl)iodonium camphanylsulfonate, perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethanesulfonates and others; trifluoromethanesulfonate esters of hydroxyimides, α,α'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods of the invention will be known to those skilled in the art.

As mentioned above, the photoresist composition may contain other components and additives. For example, the photoresist composition may also include dissolution inhibitors. If dissolution inhibitors are present, they will typically represent in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are transparent at the wavelength of interest, exhibit a moderating influence on $T_g$, strong etch resistance, and display good thermal stability (i.e., stability at temperatures of about 140° C. or greater). Suitable dissolution inhibitors include, but are not limited to bisphenol A derivatives and carbonate derivatives wherein the hydroxyl group of bisphenol A is replaced by tert-butyl derivative substituents such as tert-butyloxy, tert-butyloxycarbonyl, and tert-butyloxycarbonyl-methyl groups; normal or branched chain acetal groups such as 1-ethoxyethyl, 1-propoxyethyl, 1-n-butoxyethyl, 1-isobutoxy-ethyl, 1-tert-butyloxyethyl, and 1-tert-amyloxyethyl groups; and cyclic acetal groups such as tetrahydrofuranyl, tetrahydropyranyl, and 2-methoxytetrahydropyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.,* cited supra); hydroxyl-substituted analogs of such compounds (ibid.); and androstane-17-alkylcarboxylates substituted with 1 to 3 $C_1$–$C_4$ fluoroalkyl carbonyloxy substituents, such as t-butyl trifluoroacetyllithocholate (see, e.g., U.S. Pat. No. 5,580,694 to Allen et al.).

The remainder of the resist composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl eters such as methyl cellosolve, butyl acetate, 2-ethoxyethanol, and ethyl 3-ethoxypropionate. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally-derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

Suitable compositional ranges for the present photoresist are as follows:

| Component | wt. % solids | wt. % total |
|---|---|---|
| homogeneous blend | 50–99 | 5–50 |
| | 95–99 preferred (no DI) | 10–20 preferred |
| | 80–90 preferred (with DI) | |
| Dissolution Inhibitor (DI) | 1–40, if present | 0.5–5 |
| | 5–30 preferred | 1–3 preferred |
| Acid Generator | 0.5–10 | 0.05–2 |
| | 1–5 preferred | 0.1–1 preferred |
| Solvent(s) | NA | 50–95 |
| | | 80–90 preferred |
| Other components | 0–20 | 0–4 |
| | 0.001–5 preferred | 0–1 preferred |

Use in Generation of Resist Images on a Substrate

The present invention also relates to a process for generating a resist image on a substrate comprising the steps of: (a) coating a substrate with a film comprising the novel lithographic resist composition of the present invention; (b) imagewise exposing the film to radiation; and (c) developing the image. The first step involves coating the substrate with a film comprising the resist composition dissolved in a suitable solvent. Suitable substrates are silicon-containing, and include, for example, silicon dioxide, silicon nitride, and silicon oxynitride. The substrate may or may not be coated with an organic anti-reflective layer prior to deposition of the resist composition. Preferably, the surface of the substrate is cleaned by standard procedures before the film is deposited thereon. Suitable solvents for the composition are as described in the preceding section, and include, for example, ethyl 3-ethoxypropionate, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90–150° C. for a short period of time, typically on the order of about 1 minute. The dried film has a thickness of about 0.1–5.0 microns, preferably about 0.2–1.2 microns. In the second step of the process, the film is imagewise exposed to x-ray, electron beam, or ultraviolet radiation, preferably ultraviolet radiation at a wavelength of about 190–350 nm, preferably 248 nm. The preferred radiation source is KrF excimer. Conveniently, due to the enhanced radiation sensitivity of the resist film, a resist film (1 micron thickness) is fully exposed with less than about 35 mJ/cm$^2$ of radiation, more preferably less than about 25 mJ/cm$^2$. The radiation is absorbed by the radiation-sensitive acid generator to generate free acid which with heating causes cleavage of the acid-cleavable ester substituent and formation of the corresponding acid. Preferably, after the film has been exposed to radiation, the film is again heated to an elevated temperature of about 90–150° C. for a short period of time, on the order of about 1 minute.

The third step involves development of the image with a suitable solvent. Suitable solvents include an aqueous base, preferably an aqueous base without metal ions such as the industry standard developer tetramethylammonium hydroxide or choline. The resist composition of the present invention has high radiation sensitivity and provides positive images with high contrast and straight walls. The novel composition can also be readily developed in industry standard developer. Development is without unacceptable thinning or swelling. The resist has suitable thermal properties Tg and good adhesion and planarization. Uniquely, the dissolution property of the composition of the present invention can be varied by simply varying the composition of the polymer. Because the polymer has a very low optical density in the deep UV, the resist composition is uniquely suitable for use in the deep UV, especially at 48 nm.

The composition of the present invention may be used to make an integrated circuit assembly, such as an integrated circuit chip, multichip module, or circuit board. The integrated circuit assembly comprises a circuit formed on a substrate by the steps of. (a) coating a substrate with a film comprising the resist composition of the present invention, (b) imagewise exposing the film to radiation, (c) developing the image to expose the substrate, and (d) forming the circuit in the developed film on the substrate by art-known techniques. After the substrate has been exposed, circuit patterns can be formed in the exposed areas by coating the substrate with a conductive material such as conductive metals by art-known techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p-doped or n-doped circuit transistors. Other means for forming circuits are well known to those skilled in the art.

The composition of the present invention can be used in a dry etching method where the substrate is etched by ions, radicals, atoms, or molecules in the plasma. After the substrate coated with the photoresist composition has been imagewise exposed and developed, it is placed under a high vacuum, and a reaction gas is used to generate the plasma. In dry etching, various types of gases can be used, in accordance with the substrate to be etched. In the case where the substrate is, for example, silicon or silicon oxide, a fluorine-based or fluorine-hydrogen-based etching gas is used, carbon tetrafluoride being the most commonly used gas.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entirety.

EXPERIMENTAL

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

The hydroxystyrene-t-butyl acrylate copolymer was made according to U.S. Pat. Nos. 5,492,793 and 5,625,020. The hydroxystyrene-styrene copolymer was obtained from Triquest, Nippon Soda (Japan).

EXAMPLE 1

The Synthesis of the Protected Hydroxystyrene Copolymer

A 22 L reactor was charged with 2.919 kg acetoxystyrene, 1.538 kg t-butyl acrylate, 231 g BPO and 6 L toluene. The reactor was purged with nitrogen, and the reaction solution was heated at 60° C. under a $N_2$ atmosphere for 23 h. The solution was then cooled to room temperature, diluted with an additional 12 L of toluene, and 248 L of heptane:isopropyl alcohol (30:1) was added. The precipitate was collected by vacuum filtration, and washed with 24 L heptane. The solid was recrystalized by first dissolving it in 15 L acetone and then adding 300 L isopropyl alcohol:water (51:24 v/v). The product was collected by vacuum filtration, rinsed with 30 L 1:1 isoproyl alcohol:water, and then dried at 50–55° C. under vacuum to a constant weight.

EXAMPLE 2

The Synthesis of the Hydroxystyrene Copolymer

The product of Example 1 was dissolved in 16.5 L of MeOH in a 22 L reactor, the reactor was purged with $N_2$ atmosphere, and the temperature of the solution was gradually brought to 40° C. over 1 h. 375 mL $NH_4OH$ was then added while maintaining the nitrogen atmosphere. The reaction solution was then heated at 40° C. for 8 h. The solution was then cooled to room temperature, and precipitated with 240 L $H_2O$. The solid was collected by filtration, rinsed with water, and recrystalized from 25 L acetone and 240 L water. The solid was collected by suction filtration, rinsed with water, and dried under vacuum at 50–55° C. to constant weight.

EXAMPLE 3

Evaluation of Resist Performance

Figure 1:
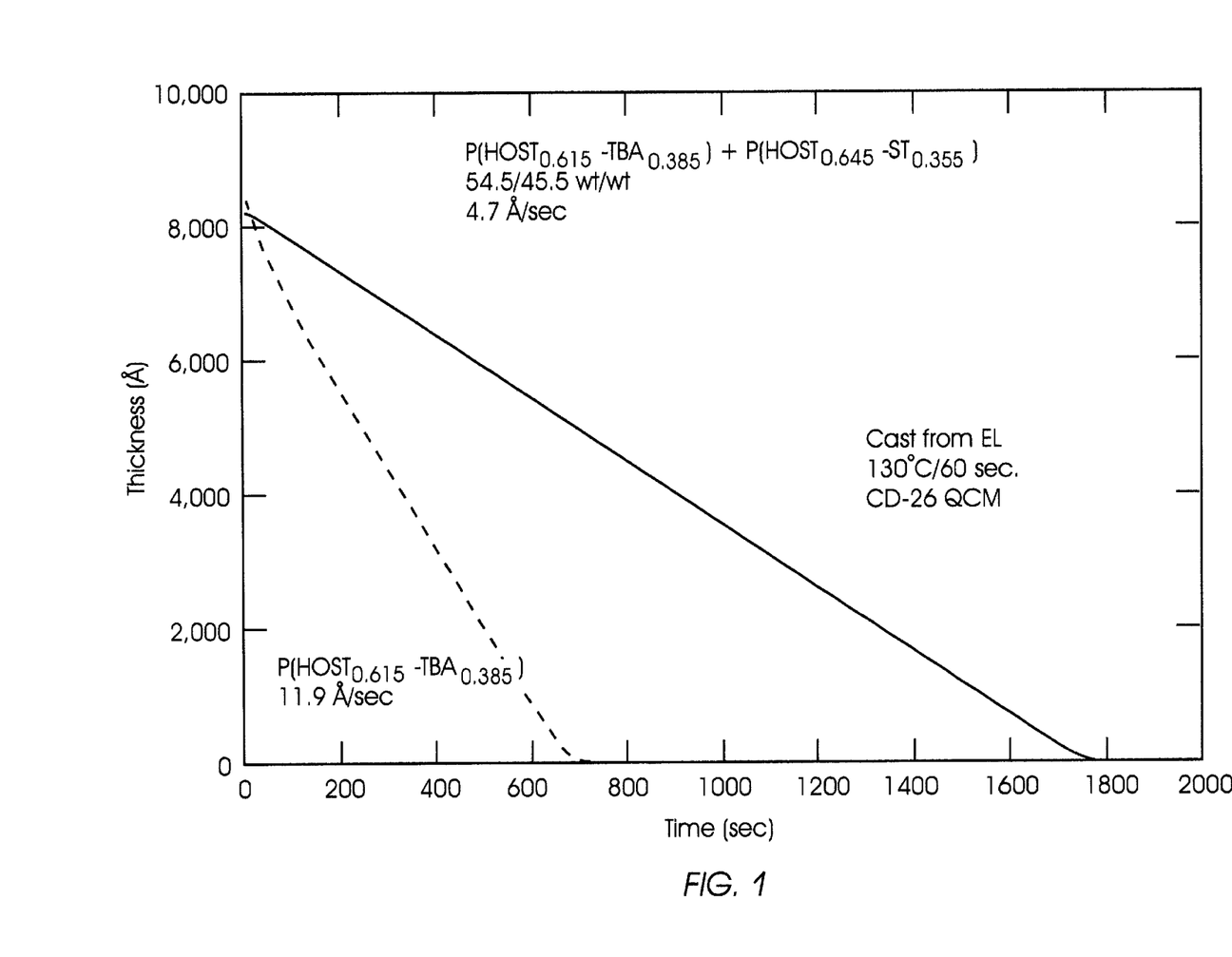
FIG. 1 is a graph illustrating the dissolution kinetics of a photoresist binder composition comprised of a homogeneous blend of poly(hydroxystyrene-co-t-butyl acrylate) polymer and a phenolic polymer spin-coated on quartz (as described in Example 1).

A photoresist binder composition was prepared by mixing the hydroxystyrene-t-butyl acrylate copolymer (62:38 mol/mol) and the hydroxystyrene-styrene copolymer in a 54.5/45.5 wt/wt ratio. The photoresist binder composition was dissolved in ethyl lactate and spin-coated on quartz with a film thickness of 8000 Å. The film was heated to 135° C. for 60 seconds, and subjected to dissolution measurements in CD-26 on a quartz crystal microbalance (QCM). The blend film smoothly dissolved into the developer exhibiting a linear dissolution kinetics with a dissolution rate of 4.7 Å/sec (FIG. 1), suggesting that the polymers are homogeneously misicble. By comparison, the dissolution rate of the hydroxystyrene-t-butyl acrylate copolymer (62:38 mol/mol) alone is 11.9 Å/sec, and the dissolution rates of the terpolymers P(hydroxystyrene$_{0.65}$-styrene$_{0.20}$-t-butyl acrylate$_{0.15}$) and P(hydroxystyrene$_{0.60}$-styrene$_{0.20}$-t-butyl acrylate$_{0.20}$) are 7.7 and 0.83 Å/sec, respectively.

A photoresist binder composition was prepared by mixing the hydroxystyrene-t-butyl acrylate copolymer and the random phenolic polymer (P(hydroxystyrene$_{0.69}$-styrene$_{0.31}$)) with a narrow molecular weight distribution of about 1.12 in about a 1/1 wt/wt ratio. The photoresist binder composition was dissolved in ethyl lactate and spin-coated on quartz with a film thickness of 8000 Å. The film was heated to 135° C. for 60 seconds, and subjected to dissolution measurements in CD-26 on a quartz crystal microbalance (QCM). The blend film smoothly dissolved into the developer exhibiting a linear dissolution kinetics with a dissolution rate of 1.3 Å/sec in CD-26. The dissolution rate of 6.7 Å/sec in CD-26 was measured when block phenolic polymer of Example 2 (P(hydroxystyrene$_{0.71}$-styrene$_{0.29}$)) was used in the resist composition.

EXAMPLE 4

Evaluation of Lithographic Resist Composition

Figure 2:
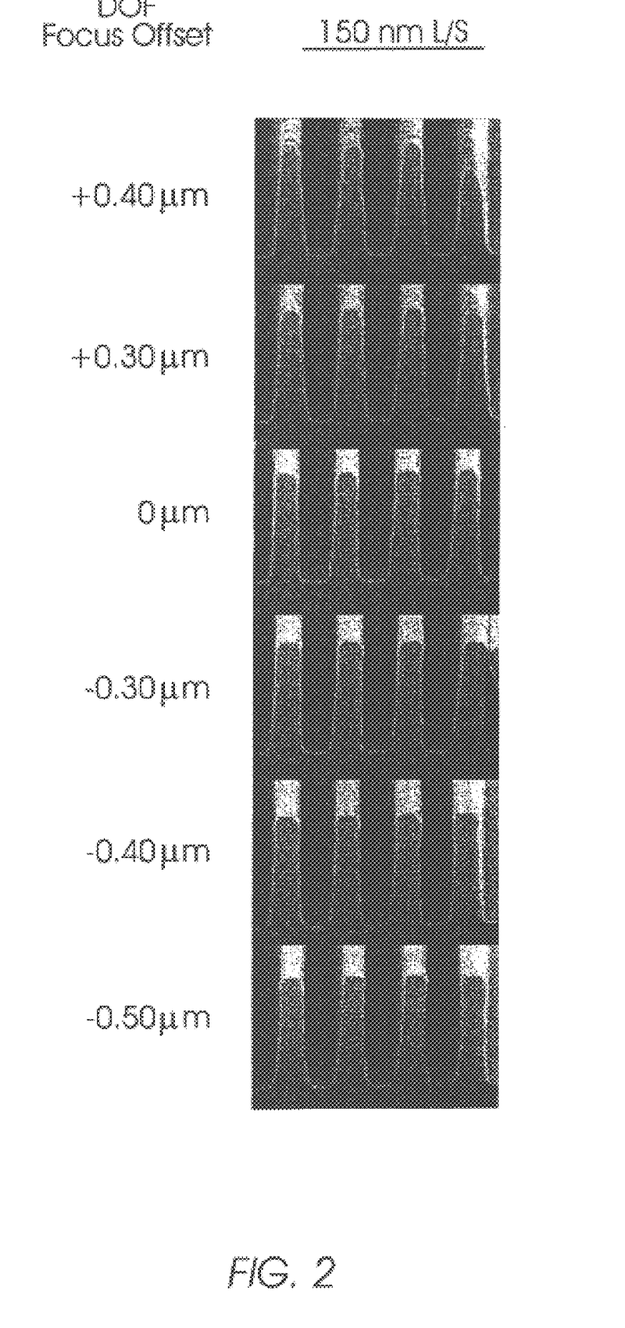
FIG. 2 illustrates an array of patterned images created by using a composition of present invention (as described in Example 2).

A photoresist binder composition was prepared by mixing the hydroxystyrene-t-butyl acrylate copolymer and the hydroxystyrene-styrene copolymer in such a ratio that the final composition was hydroxystyrene/styrene/t-butyl acrylate of 60/20/20. The polymer blend was dissolved in ethyl lactate and ethyl 3-ethoxypropionate (7/3 wt/wt ratio). An iodonium acid generator comprising an equimolar mixture of di-(t-butylphenyl)iodonium camphorsulfonate and perfluorobutanesulfonate. The iodonium acid generator was added to the polymer solution in a ratio of 1:20 wt/wt to the polymer powder. Then, tetramethylammonium hydroxide, at 0.25 mol % of the iodonium acid generator, was added to the solution. The resulting resist solution was coated on silicon wafers treated with an organic anti-reflective coating (AR3). Coating was carried out using standard solution spin-casting means to 600 Å thickness. Following coating, the resulting film was baked at 130° C. for 60 s, imagewise-exposed to a ASML 0.63 NA KrF excimer laser stepper with 5/8 annular illumination. Following exposure, the film was heated at 130° C. for 90 s, and developed with a sulfacted 0.263 N Nme$_4$OH developer for 60 s. Inspection of the array of patterned images by electron microscopy (FIG. 2) indicated that the blend resist was capable of resolving fine features (150 nm line space structures).

What is claimed is:

1. A photoresist binder composition comprising a homogeneous blend of (i) a hydroxystyrene copolymer comprising a first monomer that is a substituted or unsubstituted hydroxystyrene and a second monomer containing a photoacid-cleavable alicyclic ester group, and (ii) a phenolic polymer.

2. The binder composition of claim 1, wherein the first monomer is a substituted hydroxystyrene.

3. The binder composition of claim 2, wherein the substituted hydroxystyrene contains at least one substituent selected from the group consisting of halogen, alkyl, alkoxy, alkenyl, alkynyl, sulfonyl, alkyl ester, alkylthio, cyano, and nitro, and combinations thereof.

4. The binder composition of claim 1, wherein the second monomer comprises an acrylate.

5. The binder composition of claim 4, wherein the acrylate is selected from the group consisting of acrylate, methacrylate, fluoroacrylate and chloroacrylate, and combinations thereof.

6. The binder composition of claim 1, wherein the alicyclic ester substituent is selected from the group consisting of adamantyl, norbornyl, 2-methyl-2-adamantyl, 2-methyl-2-isobornyl, 2-methyl-2-tetracyclododecenyl, 2-methyl-2-dihydrodicyclopentadienylcyclohexyl and 1-methylcyclohexyl, and combinations thereof.

7. The binder composition of claim 1, wherein the hydroxystyrene copolymer is poly(4-hydroxystyrene-co-t-butyl acrylate).

8. The binder composition of claim 1, wherein the hydroxystyrene copolymer is poly(4-hydroxystyrene-co-t-butyl methacrylate).

9. The binder composition of claim 1, wherein the phenolic polymer consists of one, two or three monomers having free hydroxyl groups.

10. The binder composition of claim 9, wherein the phenolic polymer is selected from the group consisting of polyhydroxystyrene, poly(hydroxystyrene-co-styrene), poly(hydroxystyrene-co-styrene-co-t-butyl acrylate), novolac, and combinations thereof.

11. The binder composition of claim 9, wherein a fraction of the free hydroxyl is protected with a protecting group.

12. The binder composition of claim 11, wherein the fraction is less than about half.

13. The binder composition of claim 12, wherein the protected hydroxyl are protected with an acid-inert protecting group to give an OR moiety wherein R represents the protecting group.

14. The binder composition of claim 13, wherein the acid-inert protecting group is selected from the group consisting of primary alkyl, secondary alkyl, cycloalkyl, aryl, acetyl, primary carbonate, and a secondary carbonate.

15. The binder composition of claim 12, wherein the protected hydroxyl groups are protected with an acid-labile protecting group to give an OR moiety wherein R represents the protecting group.

16. The binder composition of claim 15, wherein the acid-labile protecting group is selected from the group consisting of t-butyl, tetrahydropyran-2-yl, tetrahydrofuran-2-yl, and substituted t-butyl, and combinations thereof.

17. The binder composition of claim 15, wherein the acid-labile protecting group is selected from the group consisting of 2-methyl-2-adamantyl, 2-methyl-2-isobornyl, 2-methyl-2-tetracyclododecenyl, 2-methyl-2-dihydrodicyclopentadienylcyclohexyl and 1-methylcyclohexyl, and combinations thereof.

18. The binder composition of claim 1, wherein the hydroxystyrene copolymer and the phenolic polymer in the blend are present in a molar ratio effective to give a desired dissolution rate.

19. The binder composition of claim 18, wherein the ratio is in the range of about 70:30 to about 30:70.

20. The binder composition of claim 19, wherein the ratio is in the range of about 60:40 to 40:60.

21. A lithographic resist composition, comprising:
   a homogeneous blend of (i) a hydroxystyrene copolymer comprising a first monomer that is substituted or unsubstituted hydroxystyrene and a second monomer containing a photoacid-cleavable alicyclic ester group, and (ii) a phenolic polymer; and
   a radiation-sensitive acid generator which generates an acid upon exposure to radiation.

22. The resist composition of claim 21, wherein the first monomer is a substituted hydroxystyrene.

23. The resist composition of claim 22, wherein the substituted hydroxystyrene contains at least one substituent selected from the group consisting of halogen, alkyl, alkoxy, sulfonyl, alkyl ester, alkylthio, cyano, and nitro, and combinations thereof.

24. The resist composition of claim 21, wherein the second monomer comprises an acrylate.

25. The resist composition of claim 24, wherein the acrylate is selected from the group consisting of acrylate, methacrylate, fluoroacrylate and chloroacrylate, and combinations thereof.

26. The resist composition of claim 21, wherein the alicyclic ester substituent is selected from the group consisting of adamantyl, norbornyl, 2-methyl-2-adamantyl, 2-methyl-2-isobornyl, 2-methyl-2-tetracyclododecenyl, 2-methyl-2-dihydrodicyclopentadienylcyclohexyl and 1-methylcyclohexyl, and combinations thereof.

27. The resist composition of claim 21, wherein the hydroxystyrene copolymer is poly(4-hydroxystyrene-co-t-butyl acrylate).

28. The resist composition of claim 21, wherein the hydroxystyrene copolymer is poly(4-hydroxystyrene-co-t-butyl methacrylate).

29. The resist composition of claim 21, wherein the phenolic polymer comprises of one, two or three monomers having free hydroxyl groups.

30. The resist composition of claim 29, wherein the phenolic polymer is selected from the group consisting of polyhydroxystyrene, poly(hydroxystyrene-co-styrene), poly(hydroxystyrene-co-styrene-co-t-butyl acrylate), novolac, and combinations thereof.

31. The resist composition of claim 29, wherein a fraction of the free hydroxyl is protected with a protecting group.

32. The resist composition of claim 31, wherein the fraction is less than about half.

33. The resist composition of claim 32, wherein up to half of the free hydroxyl groups of the phenolic polymer are protected with an acid-inert protecting group to give an OR moiety wherein R represents the protecting group.

34. The resist composition of claim 33, wherein the acid-inert protecting groups is selected from the group consisting of: primary alkyl, secondary alkyl, cycloalkyl, aryl, acetyl, primary carbonate, and a secondary carbonate.

35. The resist composition of claim 32, wherein up to half of the free hydroxyl groups of the phenolic polymer are protected with an acid-labile protecting group to give an OR moiety wherein R represents the protecting group.

36. The resist composition of claim 35, wherein the acid labile protecting group is selected from the group consisting of t-butyl, tetrahydropyran-2-yl, tetrahydrofuran-2-yl, and substituted t-butyl, and combinations thereof.

37. The resist composition of claim 35, wherein the acid-labile protecting group is an ester selected from the group consisting of 2-methyl-2-adamantyl, 2-methyl-2-isobornyl, 2-methyl-2-tetracyclododecenyl, 2-methyl-2-dihydrodicyclopentadienylcyclohexyl and 1-methylcyclohexyl, and combinations thereof.

38. The resist composition of claim 21, wherein the hydroxystyrene copolymer and the phenolic polymer in the blend are present in a molar ratio effective to give a desired dissolution rate.

39. The resist composition of claim 38, wherein the ratio is in the range of about 70:30 to 30:70.

40. The resist composition of claim 39, wherein the ratio is in the range of about 60:40 to 40:60.

41. The resist composition of claim 21, wherein the radiation-sensitive acid generator is benzoin tosylate, t-butylphenyl α-(p-toluenesulfonyloxy)-acetate, t-butyl α-(p-toluenesulfonyloxy)acetate, N-camphorsulfonyloxynaphthalimide, N-pentafluorophenylsulfonyloxynaphthalimide, diaryliodonium sulfonate, bis-(di-t-butylphenyl)iodonium camphanylsulfonate, perfluoroalkanesulfonates, N-sulfonyloxynaphthnalimide, triphenylsulfonium triflate, bis-(t-butylphenyl)iodonium triflate, triarylsulfonium, diaryliodonium hexafluoroantimonates, hexafluoroarsenates, trifluoromethanesulfonates, or pefluorobutanesulfonate, and combinations thereof.

42. The resist composition of claim 41, wherein the radiation-sensitive acid generator is a mixture of bis-(di-t-butylphenyl)iodonium camphorsulfonate and perfluorobutanesulfonate.

43. The resist composition of claim 41, wherein the radiation-sensitive acid generator comprises about 5% by weight based on the total weight of the polymer.

44. The resist composition of claim 21, further including an effective amount of a dissolution inhibitor.

45. The resist composition of claim 44, wherein the dissolution inhibitor is selected from the group consisting of: t-butyloxycarbonate-bisphenol-A, t-butylacetoxy-bisphenol-A, O-benzoquinonediazide sulfonic acid ester, napthoquinonediazide sulfonic acid ester; lower alkyl esters of cholic acid, lithocholic acid and ursocholic acid; hydroxyl-substituted lower alkyl esters of cholic acid, lithocholic acid and ursocholic acid; and androstane-17-alkylcarboxylate having 1 to 3 $C_1$–$C_4$ fluoroalkyl carbonyloxy substituents.

46. The resist composition of claim 21 or 44, further including an acid-diffusion controlling additive.

47. The resist composition of claim 46, wherein the acid-diffusion controlling additive is tetramethylammonium hydroxide.

48. A photoresist binder composition comprising a homogeneous blend of (i) a hydroxystyrene copolymer comprising a first monomer that is a substituted or unsubstituted hydroxystyrene and a second monomer containing a photoacid-cleavable group, and (ii) a phenolic hydroxystyrene copolymer comprising a first phenolic monomer that is a substituted or unsubstituted hydroxystyrene and a second phenolic monomer that is a substituted styrene or a differently substituted hydroxystyrene containing at least one substituent selected from the group consisting of halogen, $C_{2-8}$ alkyl, alkoxy, sulfonyl, alkyl ester, alkylthio, cyano, and nitro, and combinations thereof.

49. The binder composition of claim 48, wherein the first monomer is a substituted hydroxystyrene.

50. The binder composition of claim 48, wherein the second monomer comprises an acrylate.

51. The binder composition of claim 48, wherein the photoacid-cleavable group is an ester moiety.

52. The binder composition of claim 48, wherein the phenolic copolymer consists of one, two or three monomers having free hydroxyl groups.

53. The binder composition of claim 52, wherein a fraction of the free hydroxyl is protected with a protecting group.

54. The binder composition of claim 53, wherein the fraction is less than about half.

55. The binder composition of claim 54, wherein the protected hydroxyl are protected with an acid-inert protecting group to give an OR moiety wherein R represents the protecting group.

56. The binder composition of claim 54, wherein the protected hydroxyl groups are protected with an acid-labile protecting group to give an OR moiety wherein R represents the protecting group.

57. The binder composition of claim 48, wherein the hydroxystyrene copolymer and the phenolic polymer in the blend are present in a molar ratio effective to give a desired dissolution rate.

58. A lithographic resist composition, comprising:
a homogeneous blend of (i) a hydroxystyrene copolymer comprising a first monomer that is substituted or unsubstituted hydroxystyrene and a second monomer containing a photoacid-cleavable group, and (ii) a phenolic hydroxystyrene copolymer comprising a first phenolic monomer that is a substituted or unsubstituted hydroxystyrene and a second phenolic monomer that is a substituted styrene or differently substituted hydroxystyrene containing at least one substituent selected from the group consisting of halogen, $C_{2-8}$ alkyl, alkoxy, sulfonyl, alkyl ester, alkylthio, cyano, and nitro, and combinations thereof; and
a radiation-sensitive acid generator which generates an acid upon exposure to radiation.

59. The resist composition of claim 58, wherein the first monomer is a substituted hydroxystyrene.

60. The resist composition of claim 58, wherein the second monomer comprises an acrylate.

61. The resist composition of claim 58, wherein the photoacid-cleavable group is an ester moiety.

62. The resist composition of claim 58, wherein the phenolic copolymer consists of one, two or three monomers having free hydroxyl groups.

63. The resist composition of claim 62, wherein a fraction of the free hydroxyl is protected with a protecting group.

64. The resist composition of claim 63, wherein the fraction is less than about half.

65. The resist composition of claim 64, wherein up to half of the free hydroxyl groups of the phenolic polymer are protected with an acid-inert protecting group to give an OR moiety wherein R represents the protecting group.

66. The resist composition of claim 64, wherein up to half of the free hydroxyl groups of the phenolic polymer are protected with an acid-labile protecting group to give an OR moiety wherein R represents the protecting group.

67. The resist composition of claim 58, wherein the hydroxystyrene copolymer and the phenolic polymer in the blend are present in a molar ratio effective to give a desired dissolution rate.

68. A photoresist binder composition comprising a homogeneous blend of (i) a hydroxystyrene copolymer comprising a first monomer that is a substituted or unsubstituted hydroxystyrene and a second monomer containing a photoacid-cleavable group, and (ii) a phenolic hydroxystyrene copolymer comprising poly(4-hydroxystyrene-co-styrene-co-t-butyl acrylate).

69. A lithographic resist composition, comprising:

a homogeneous blend of (i) a hydroxystyrene copolymer comprising a first monomer that is substituted or unsubstituted hydroxystyrene and a second monomer containing a photoacid-cleavable group, and (ii) a phenolic hydroxystyrene copolymer comprising poly(4-hydroxystyrene-co-styrene-co-t-butyl acrylate); and a radiation-sensitive acid generator which generates an acid upon exposure to radiation.

* * * * *